United States Patent

Taguchi et al.

[11] Patent Number: 5,360,508
[45] Date of Patent: Nov. 1, 1994

[54] APPLYING APPARATUS

[75] Inventors: Hiroshi Taguchi, Tokyo; Yoji Washizaki, Saitama; Akira Igarashi, Tokyo; Hiroyoshi Nakano, Saitama, all of Japan

[73] Assignee: Somar Corporation, Tokyo, Japan

[21] Appl. No.: 998,638

[22] Filed: Dec. 31, 1992

Related U.S. Application Data

[63] Continuation of Ser. No. 648,458, Jan. 30, 1991, abandoned.

[30] Foreign Application Priority Data

Jun. 1, 1990 [JP] Japan ................... 2-143521

[51] Int. Cl.$^5$ .......................................... B32B 31/00
[52] U.S. Cl. ........................... 156/521; 156/552; 156/555; 156/556; 271/267; 271/69; 271/84; 118/227; 118/249; 118/258
[58] Field of Search ............... 156/497, 521, 522, 552, 156/555, 556; 118/227, 249, 258; 271/267, 268, 272, 69, 84

[56] References Cited

U.S. PATENT DOCUMENTS

| | | | |
|---|---|---|---|
| 2,803,078 | 8/1957 | Coughlin | 118/249 |
| 4,643,415 | 2/1987 | Kuehnert | 271/268 |
| 4,650,536 | 3/1987 | Ceraso | 156/521 |
| 4,938,826 | 7/1990 | Hanitzsch | 156/522 |
| 4,986,873 | 1/1991 | Hamamura | 156/521 |

FOREIGN PATENT DOCUMENTS

63-208037 8/1988 Japan.

*Primary Examiner*—David A. Simmons
*Assistant Examiner*—J. Sells
*Attorney, Agent, or Firm*—Sughrue, Mion, Zinn, Macpeak & Seas

[57] ABSTRACT

An applying apparatus for applying films to a panel includes a film feed device for feeding leading edges of the films to a tentative applying position of applying the edges to the panel, an applying device for applying the films to the panel, and a movable panel conveyance device which is moved together with the applying device.

30 Claims, 8 Drawing Sheets

APPLYING APPARATUS

This is a continuation of application Ser. No. 07/648,458 filed Jan. 30, 1991, abandoned.

The present invention relates to an applying apparatus, and more particularly to a device used in an applying apparatus by which stratified films, each comprising a photosensitive resin layer and a light-transmissible resin film, are applied, under pressure, to a panel for a printed circuit board.

BACKGROUND OF THE INVENTION

A conventional applying apparatus applies stratified films, each consisting of a light-transmissible resin film and a photosensitive resin layer exposed on its side, to a panel for a printed circuit board. More specifically, the panel is conveyed to the applying section of the apparatus by an upstream conveyor thereof, and the films are applied under pressure, to the top and bottom surfaces of the panel by pressure applying rollers while the panel is conveyed by a downstream conveyor of the applying apparatus to the next processing station or apparatus. After the stratified films are tentatively applied by film feed members (e.g., main vacuum suction plates) to the panel at the leading edge thereof, the pressure applying rollers are moved to the tentative application position and pressure-apply the films to the panel. The pressure applying rollers are described in Japanese Patent Application (OPI) No. 208037/88 (the term "OPI" as used herein means an "unexamined published application").

With the conventional applying apparatus, the leading edges of the stratified films are tentatively applied to the panel by the film feed members, and thereafter the pressure applying rollers are moved to the tentative application position and pressure-apply the films to the panel. Since the panel is being conveyed during the time that each of the pressure applying rollers are moving to the tentative application position, the panel is not securely supported at its leading end portion by the pressure applying rollers or any other rollers. Thus, a gap is formed between the rollers and the downstream conveyor. As a result, the panel, which is being conveyed and which is having the stratified films applied thereto by the rollers, sags at the leading edge thereof and does not proceed securely onto the downstream conveyor. Moreover, if the panel has a small thickness, the panel may fall into the gap due to the leading end portion thereof not being supported by any rollers. This is a problem.

Additionally, if the apparatus applies an air bubble preventive agent to the panel, the excess portion of the agent remains on the pressure applying rollers and the panel having the films applied thereto, so as to contaminate the panel and to accumulate thereon, thus wetting the applying apparatus and causing current to leak from the apparatus' electrical system. This is also a problem.

The present invention was designed to solve the above-described problems. Accordingly, it is an object of the present invention to provide a device in which a panel, being conveyed while having films applied on its top and bottom surfaces by pressure applying rollers of an applying apparatus, is prevented from falling between the downstream conveyor and the pressure applying rollers of the apparatus.

It is another object of the present invention to provide a device having a means for removing an air bubble preventive agent from a panel, in which an excess air bubble preventive agent clinging to the panel, having films applied thereon by an applying apparatus, is removed, thereby preventing contamination of the panel and current leakage from the apparatus' electrical system.

SUMMARY OF THE INVENTION

An applying apparatus, provided according to the present invention and designed to solve the above-mentioned problems, applies films to the top and bottom surfaces of a panel by pressure applying rollers, and includes: a film feed means for feeding the leading edges of the films to a tentative application position where the applying apparatus tentatively applies the leading edges to the panel; an applying means for applying the films to the panel (via pressure applying rollers) moved to the tentative application position; and a moveable panel conveyance means which is moved together with the applying means.

Another feature of the apparatus has the movable panel conveyance means being a part of a downstream conveyor for conveying the panel after the films have been applied thereto.

The apparatus has yet another feature that the movable panel conveyance means has a guide plate for preventing a gap from being formed between the movable panel conveyance means and the fixed conveyance portion of the downstream conveyor.

The apparatus has still yet another feature that the movable panel conveyance means has holding rollers for securely conveying the panel as the panel is applied with the films.

The apparatus has yet another feature in that it includes means for applying an air bubble preventive agent to the panel; and means for removing excess air bubble preventive agent clinging to the pressure applying rollers and the panel being conveyed while having films applied thereon.

The applying apparatus provided according to the present invention includes a movable panel conveyance means which is moved together with the pressure applying rollers, which are moved to a tentative application position and which apply the films to the panel after the leading edges of the films are tentatively applied to the panel by the film feed means. The conveyance means has a guide plate for preventing a gap from being formed between the movable panel conveyance means and the fixed conveyance portion of the downstream conveyor when the movable panel conveyance means is moved. Thus, even if the panel has a small thickness, the panel is prevented from falling from the fixed conveyance portion of the downstream conveyor. Thus, the panel is surely conveyed to the next processing station or apparatus. Since the applying apparatus includes means for wiping off excess air bubble preventive agent clinging to the pressure applying rollers and the panel, the excess air bubble preventive agent does not contaminate the panel, nor cause current to leak from the apparatus' electrical system.

BRIEF DESCRIPTION OF THE DRAWINGS

The above-mentioned and other objects, features, and advantages of the present invention will be apparent from the description herein and the drawings attached hereto. Embodiments of the present invention are hereafter described in detail in conjunction with the drawings attached hereto in which.

DETAILED DESCRIPTION OF THE PREFERRED EMBODIMENTS

Figure 7:
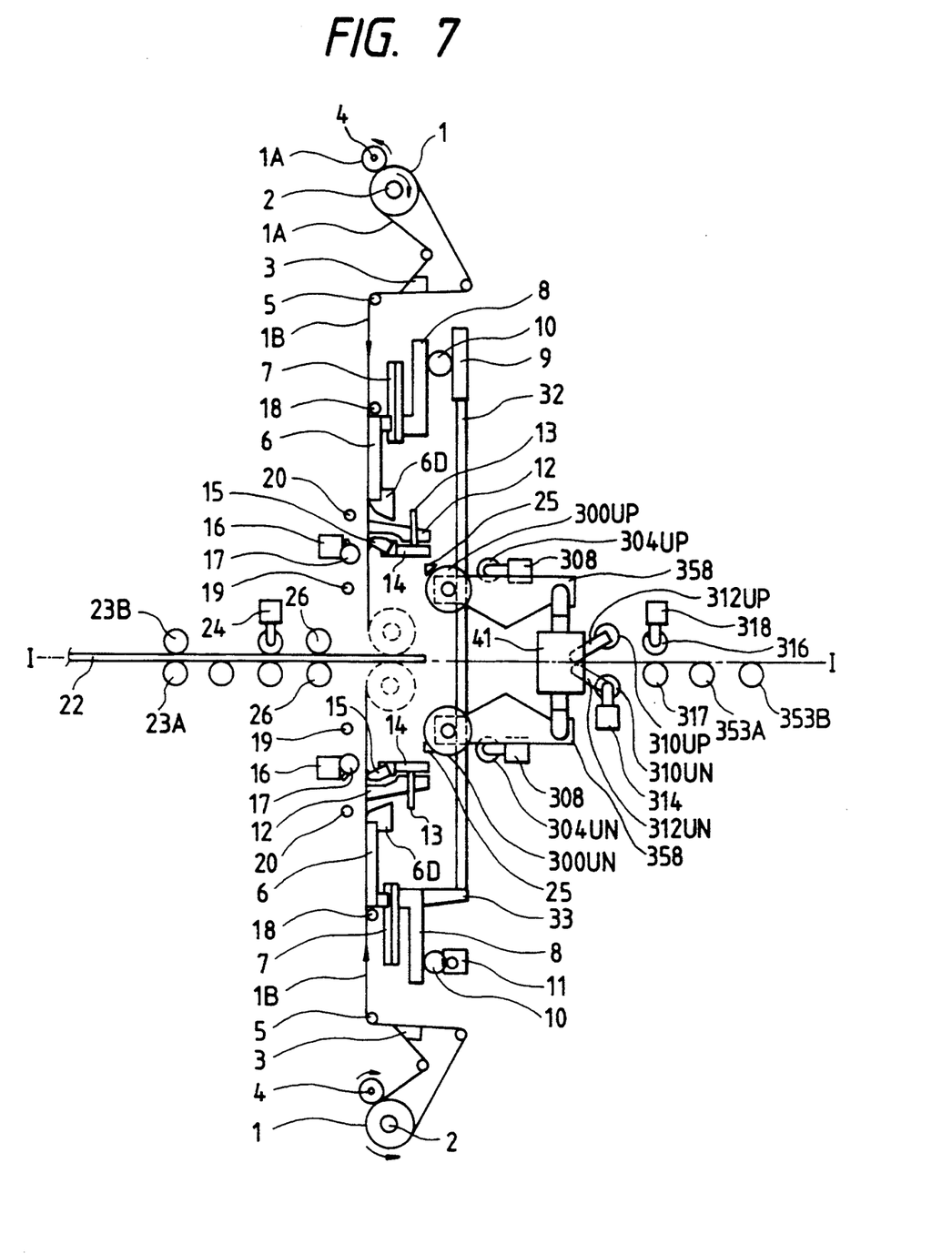
FIG. 7 is an explanatory view for showing the constitution of the applying apparatus.

In the applying apparatus shown in FIG. 7, three-layer stratified films 1, each consisting of a light-transmissible resin film, a photosensitive resin layer, and another light-transmissible resin film, are continuously wound on supply rollers 2. The stratified film 1 from each of the supply rollers 2 is separated by a film separation member 3 into a light-transmissible resin film 1A (which is a protective film) and a stratified film 1B consisting of the other light-transmissible resin film and the photosensitive resin layer exposed on its side to be applied to the panel. The separated light-transmissible resin film 1A is wound onto a winding roller 4. A pair of these winding rollers 4 are provided not only above and below a panel conveyance passage I—I, but also above and below the supply rollers 2.

The leading edge of the separated stratified film 1B is fed to a main vacuum suction plate 6 (which is a film feed member and which has a leading end portion 6D) along a tension roller 5. A static electricity eliminator 18 for the film 1B is provided near the main vacuum suction plate 6. The suction plate 6 is vertically movable toward and away from the tentative application position of the films 1B to the panel. For vertical movement, the suction plate 6 is slidably fitted on guide rails attached to a support plate 8 for the suction plate 6. The support plate 8 is coupled with a rack (not shown in the drawings) and a gear 10 to a mounting frame attached to the body (which is a casing) of the applying apparatus, so that the support plate 8 can be moved upwardly and downwardly. The gear 10 is engaged with a rack 9, provided on a coupling rod 32, which is for the support plates 8 for the upper and lower main vacuum suction plates 6 and which is connected to a drive motor 11.

A film holding member 12 for winding the leading edge portion of the stratified film 1B is slidably fitted on horizontal guide rails on the support plate 8, and is provided with a coupling notched member in which a coupling rod 13 is fitted. The coupling rod 13 is attached to a support member 14 which supports a fixed cutting member 15. A rotary cutting member 17 is rotatably supported by a support member 16. The cutting edge of the rotary cutting men%her 17 extends obliquely at a prescribed angle. Air blowoff pipes 19 and 20 for blowing air to the stratified films 1B are provided above and below the support member 16 supporting the rotary cutting member 17.

The panel 22 for the printed circuit board is conveyed by the upstream conveyor of the applying apparatus so that the stratified films 1B are applied, under heat and pressure, to the top and bottom surfaces of the panel by heat and pressure applying rollers 300UP, 300UN while the panel is conveyed to the next processing station by the downstream conveyor. The upstream conveyor includes a driving roller 23A, a driven roller 23B, a panel holder 24, wetting rollers 26 and so forth. The wetting rollers 26 apply an air bubble prevention agent to the panel when the panel passes through therebetween. The downstream conveyor includes holding rollers 316 and 317, pneumatic cylinders 318 for the holding roller 316, aluminum rollers 353A and 353B and so forth.

FIG. 7 also shows vacuum suction bars 25, panel wiping roller kinematic coupling support members 312 (312UP, 312UN), a coupling rod attaching member 33, pneumatic cylinders 41 for the heat and pressure applying rollers 300UP, 300UN, wiping rollers 304UP, 304UN for the heat and pressure applying rollers, panel wiping rollers 310UP, 310UN, pneumatic cylinders 308 for the panel wiping rollers, support members 312UP, 312UN for the panel wiping rollers, a pneumatic cylinder 314 for the panel wiping rollers, and heat and pressure applying roller support arms 358.

Figure 1:
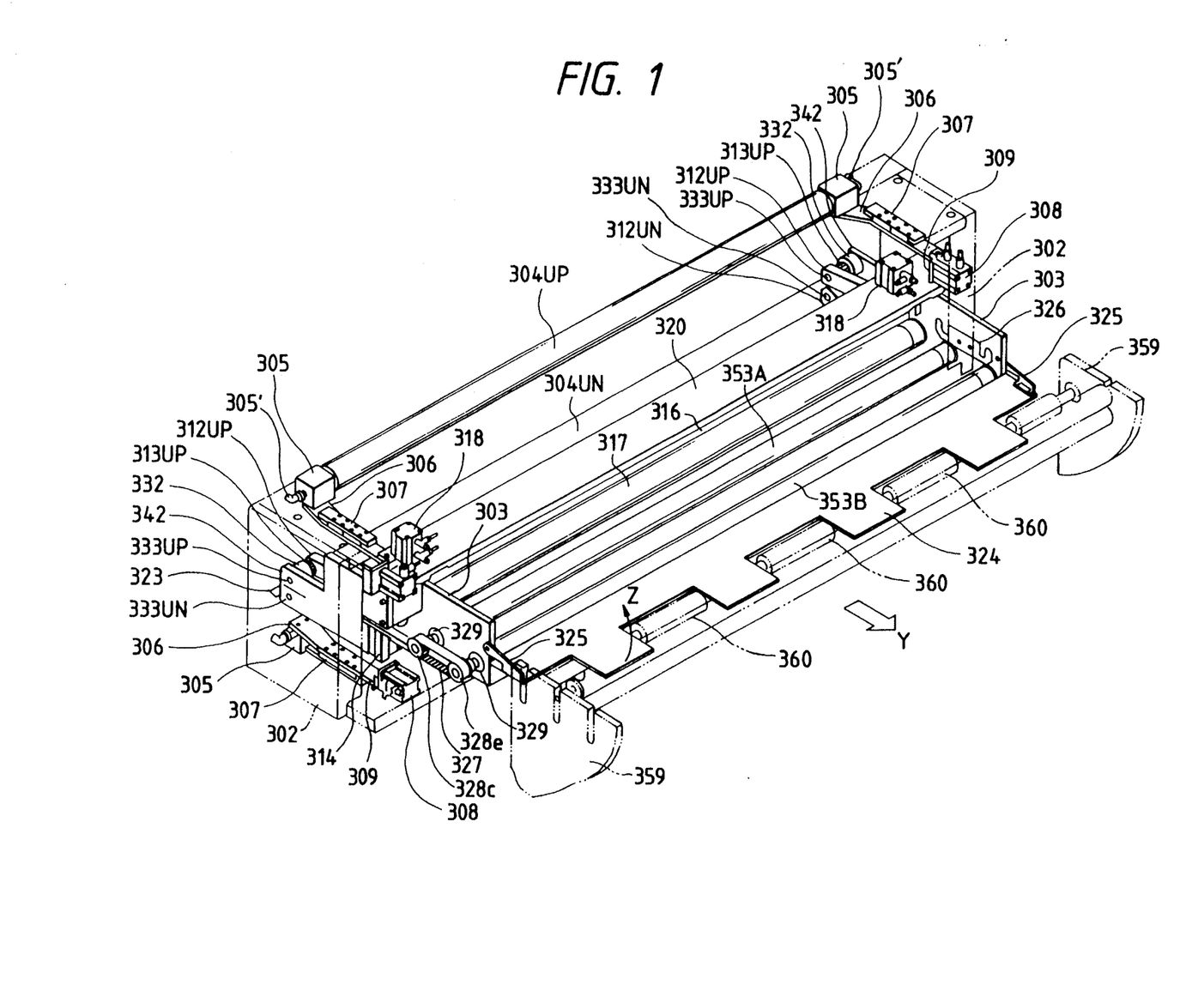
FIG. 1 is a perspective schematic view of the movable panel conveyance section of a first embodiment of an applying apparatus according to the present invention.
Figure 2:
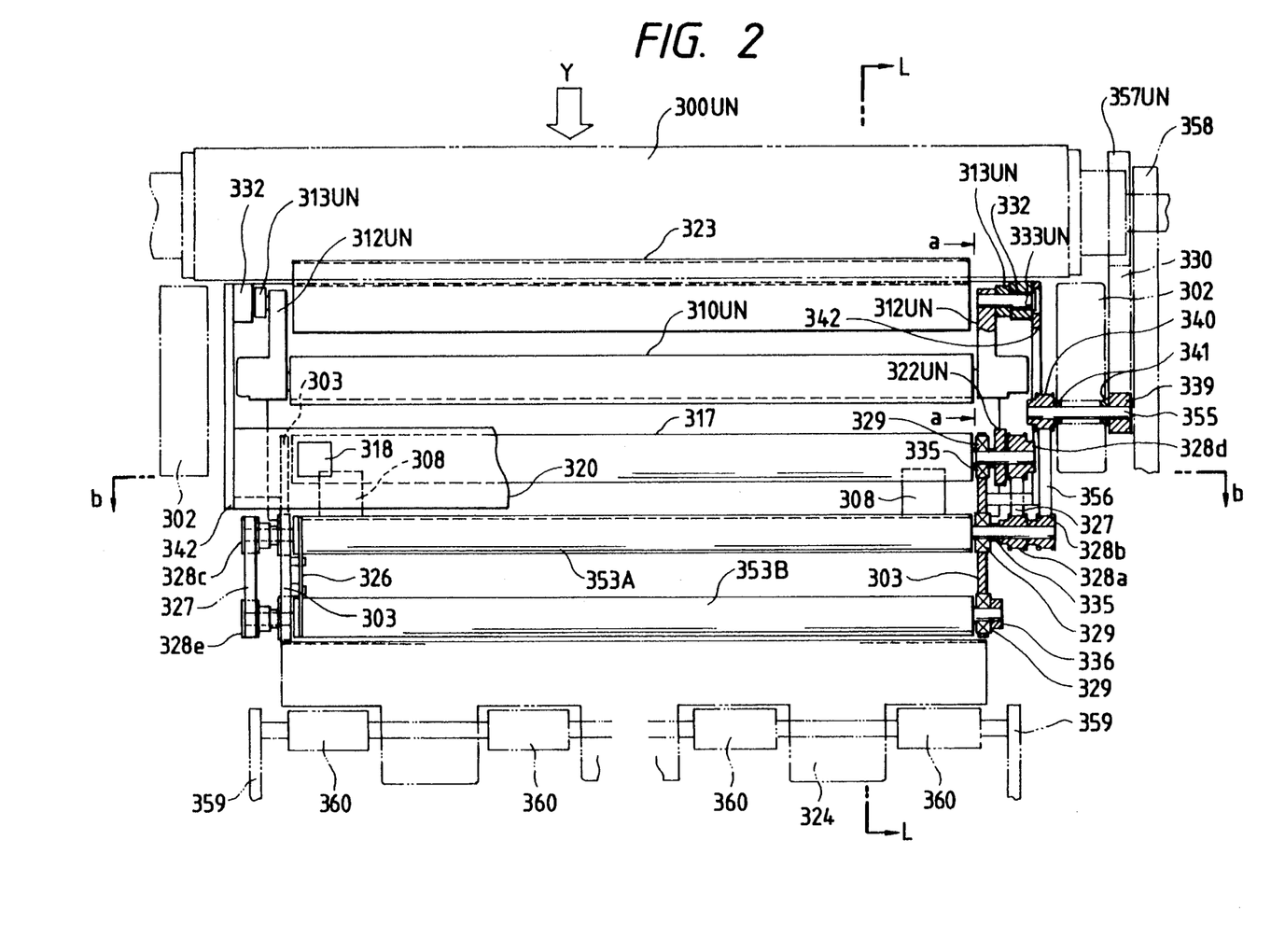
FIG. 2 is a plan view of the movable panel conveyance section.
Figure 3:
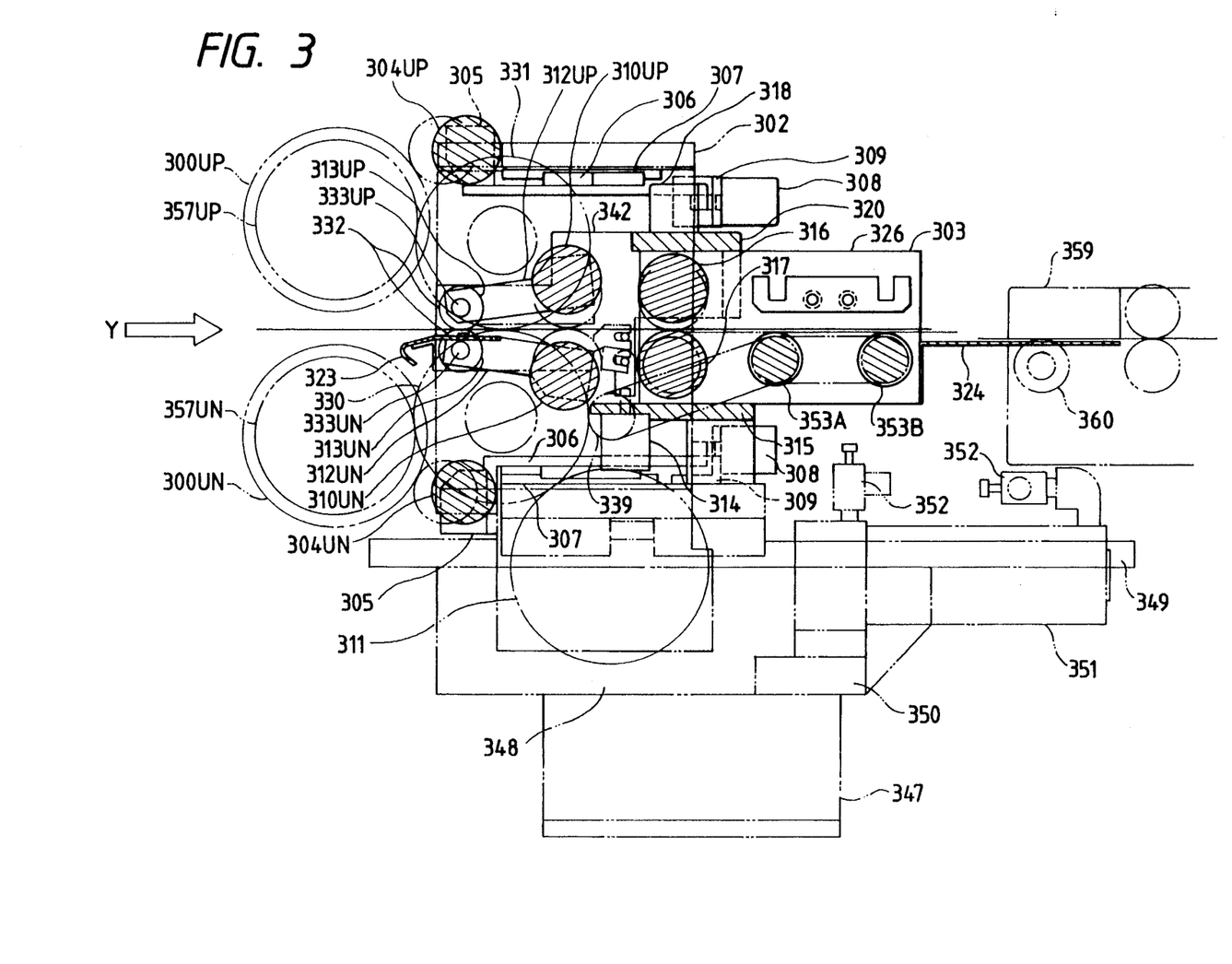
FIG. 3 is a side view of the movable panel conveyance section as viewed along arrows L shown in FIG. 2.

The constitution and operation of the movable panel conveyance section of the applying apparatus are described with reference to FIGS. 1-6 hereinafter. As shown in FIGS. 1-3, a heat and pressure applying roller mounting frame 302 is fitted on slide rails 349 attached to the body frame 347 of the applying apparatus and is located in right and left positions with regard to viewing in the conveyance direction Y of the panel 22. The slide rails 349 are secured by screws to rail support members 348. Thus, the heat and pressure applying roller mounting frame 302 is supported by the body frame 347 of the apparatus so that the mounting frame can be slidable accurately while being guided by the slide rails 349. Pneumatic cylinder attaching members 350 are secured by screws to the body frame 347. Pneumatic cylinders 351 are secured by screws to the attaching members 350. The tips of the piston rods of the pneumatic cylinders 351 are screw-engaged in the lower portion of the mounting frame 302 and secured thereto by nuts. The heat and pressure applying roller support arms 358 are attached with bearings (not shown in the drawings) to the exterior of the right and left portions of the mounting frame 302.

The shafts of the heat and pressure applying rollers 300UP, 300UN are secured with heat and pressure applying roller securing blocks (not shown in the drawings) to the support arms 358. Gears 357UP, 357UN are secured to the heat and pressure applying rollers 300UP, 300UN and are engaged with gears 331 and 330, respectively. The gear 331 is engaged with gear 330 and is secured by a screw to the shaft of a heat and pressure applying roller drive motor 301, secured to the lower portion of the mounting frame 302 at the left hand portion with regard to viewing in the conveyance direction Y of the panel 22. A through hole is provided in the mounting frame 302 at the left side thereof with regard to viewing in the direction Y. A shaft 355, rotatably supported with a bearing 341 fitted in the through hole, has a gear 339 secured thereto by a screw at one end thereof outside the mounting frame 302 and engaged with the gear 330. A pulley 340 is secured to the shaft 355 at a second end thereof by a screw.

Figure 4:
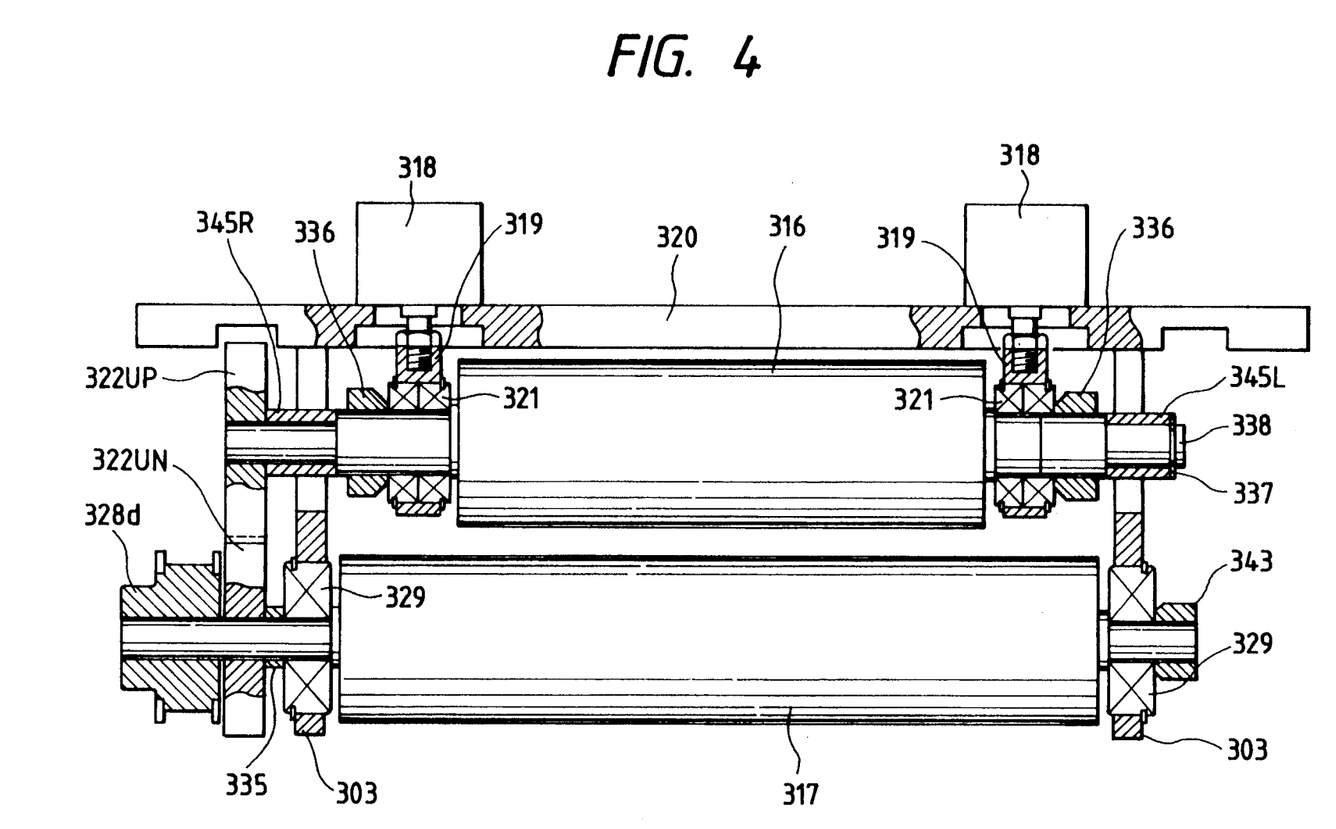
FIG. 4 is an explanatory view for describing the constitution of a holding roller section as seen along arrows B shown in FIG. 2.

A downstream conveyor mounting frame 303 is secured to the right and left interior portions of the heat and pressure applying roller mounting frame 302, and has a plurality of through holes opposed to each other and having bearings 329 fitted therein. As shown in FIGS. 2–4, the shaft of the holding roller 317 and those of the aluminum rollers 353A and 353B are rotatably supported with the bearings 329 by the downstream conveyor mounting frame 303. Outside the conveyor mounting frame 303, a gear 322UN is secured by a screw to a left hand portion of the shaft of the holding roller 317 with regard to viewing in the panel conveyance direction Y or with regard to FIG. 4 (note: at the right hand portion of the shaft with regard to FIG. 2). A pulley 328d is secured by a screw to the shaft of the holding roller 317 outside the gear 322UN. A collar 335 is provided between the gear 322UN and the mounting frame 303.

As shown in FIGS. 1–2 and 4, a cylinder attaching member 320 is secured by screws to the top of the downstream conveyor mounting frame 303. The pneumatic cylinders 318 for the holding roller 316 are secured by screws to the right and left portions of the top of the cylinder attaching member 320 so that the piston rods of the cylinders are oriented downwardly. As shown in FIG. 4, the tips of the piston rods of the cylinders 318 are screw-engaged in holding roller support member 319 and secured thereto by nuts. The shaft of the holding roller 316 is rotatably supported with bearings 321 provided in through holes of the support member 319. Stoppers 336 are secured to the shaft of the holding roller 316 outside the bearings 321. The holding roller shaft can be moved upwardly and downwardly in the U-shaped notches of the downstream conveyor mounting frame 303. Bushings 345R and 345L are provided on the right and left portions of the holding roller shaft, which are moved upwardly and downwardly in the notches. The bushing 345L is secured with a washer 337 to the shaft of the holding roller 316 by a screw so as not to detach from the mounting frame 303. A gear 322UP is secured by a screw to the holding roller shaft at the bushing 345R and is engaged with the gear 322UN.

As shown in FIG. 2, pulleys 328a and 328b are secured by screws to the shaft of the aluminum roller 353A outside the left side of the mounting frame 303 with respect to the panel conveyance direction Y or outside the right side of the mounting frame with regard to FIG. 2. A collar 335 is provided between the pulley 328a and the mounting frame 303. A pulley 328c is secured by a screw to the shaft of the aluminum roller 353A on the right exterior side of the mounting frame 303 with respect to the direction Y (the left exterior side of the mounting frame with regard to viewing FIG. 2). A pulley 328e is secured by a screw to the shaft of the second aluminum roller 353B on the right exterior side of the mounting frame 303 with respect to the conveyance direction Y (the left exterior side of the mounting frame with regard to viewing FIG. 2).

Figure 6:
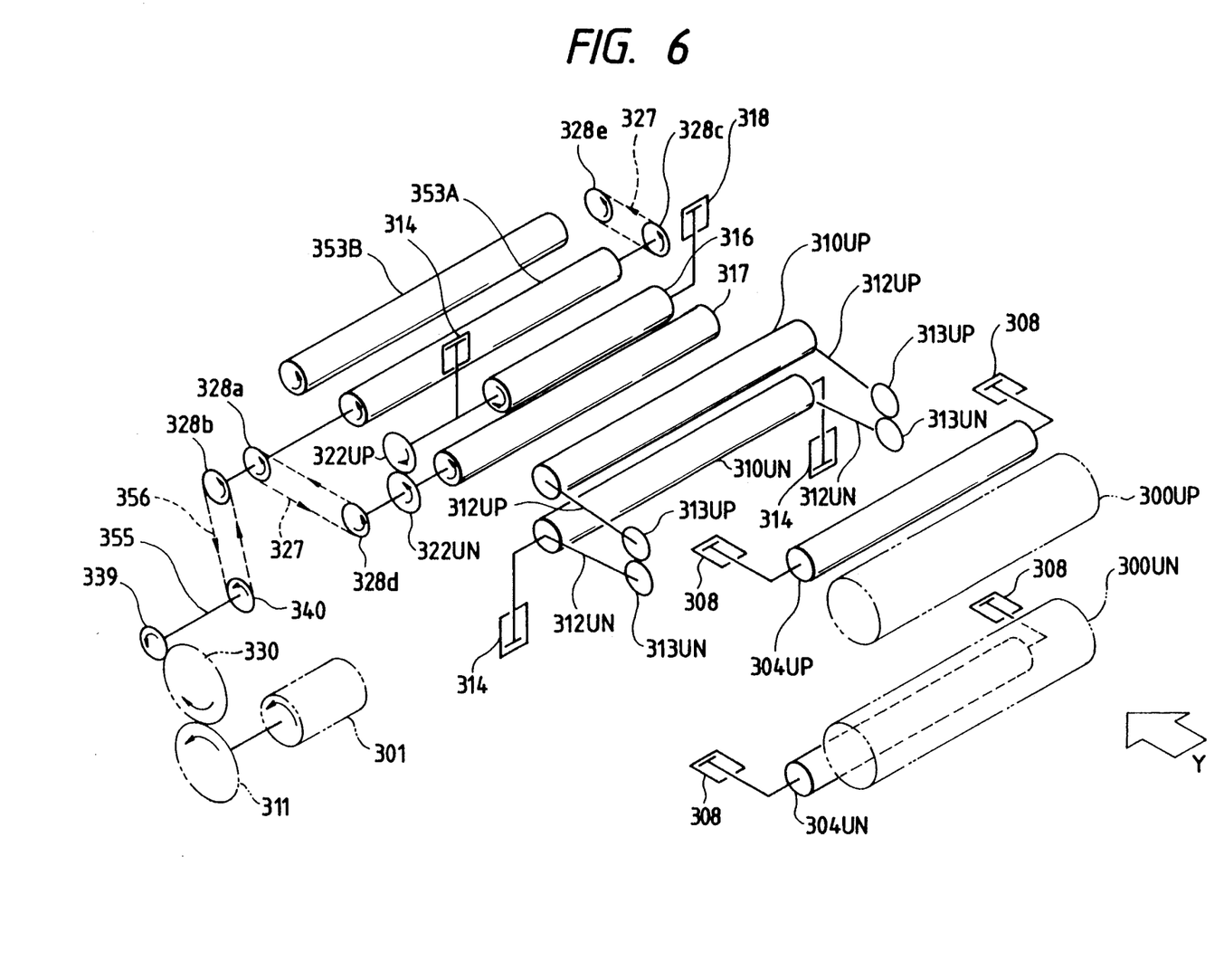
FIG. 6 is an explanatory view for describing the operation of the movable panel conveyance section.

As shown in FIGS. 2 and 6, torque is transmitted through the pulley 340, a belt 356, and the pulley 328b secured to the shaft of the aluminum roller 353A. Torque is transmitted through the pulley 328a secured to the shaft of the aluminum roller 353A, a belt 327, and a pulley 328d secured to the shaft of the holding roller 317. Torque is transmitted through the pulley 328c secured to the shaft of the aluminum roller 353A, a belt 327, and the pulley 328e secured to the shaft of the aluminum roller 353B.

The operation of the movable panel conveyance section having the above-described constitution is described in detail with reference to FIGS. 3 and 6 hereinafter. When the heat and pressure applying roller drive motor 301 is rotated in a direction shown by an arrow in FIG. 6, the torque of the motor is transmitted to the gear 330 through a gear 311 engaged therewith, and is transmitted further to the gears 331 and 339 engaged with the gear 330.

Since the gears 330 and 331 are engaged with the gears 357UN, 357UP secured to the heat and pressure applying rollers 300UN, 300UP, the rollers are rotated. Since the gear 339 is rotated, the shaft 355, having the gear 339 secured at one end thereof, is rotated so that the pulley 340 secured to the shaft at a second end thereof is rotated. The torque of the pulley 340 is transmitted through the belt 356 to the pulley 328b secured to the shaft of the aluminum roller 353A, so that the roller 353A and the pulleys 328a and 328c secured to the holding roller 317 are rotated. The torque of the pulley 328a is transmitted through the belt 327 to the pulley 328d, so that the roller 317 is rotated. Since the gears 322UN, 322UP, secured to the lower and the upper holding rollers 317 and 316, respectively, are engaged together, the holding roller 316 also is rotated. The torque of the pulley 328c secured to the shaft of the aluminum roller 353A is transmitted through the belt 327 to the pulley 328e, secured to the shaft of the aluminum roller 353B, so as to rotate the aluminum roller 353B. Thus, in the movable panel conveyance section, the holding rollers 317, 316, the aluminum rollers 353A, 353B and the heat and pressure applying rollers 300UP, 300UN are rotated simultaneously by the torque of the heat and pressure applying roller drive motor 301.

As shown in FIGS. 1–3, and 5, plates 342 are secured by screws to right and left exterior end portions of the downstream conveyor mounting frame 303. Pneumatic cylinder attaching members 315 are secured by screws to the bottoms of the right and left portions of the mounting frame 303. Guides 323 are secured by screws to the panel conveyance upstream portions of the plates 342 slightly under the panel conveyance passage. The panel conveyance upstream portion of each of the plates 342 has two through holes at a vertical interval therebetween. Shafts 333UP, 333UN rotatably extend through the holes. Linear bushings 332 are secured by screws to the mounting frame 303 and fitted around the shafts 333UP, 333UN. Wiping roller kinematic coupling gears 313UP, 313UN, which engage each other and which are provided inside of the linear bushings 332, are secured to the shafts 333UP, 333UN.

Figure 5:
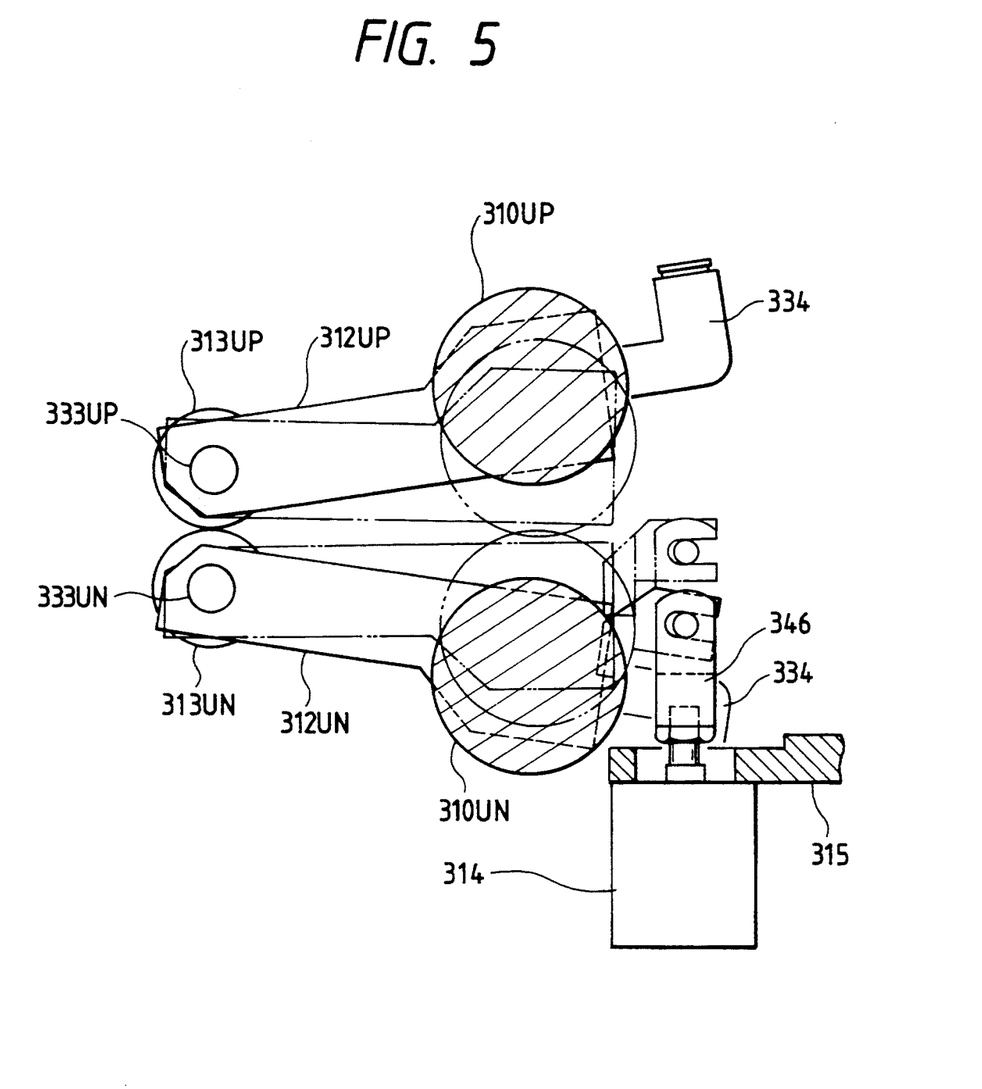
FIG. 5 is an explanatory view for describing the movement of a panel wiping roller as viewed along arrows A shown in FIG. 2.

The panel wiping roller support member 312UP, 312UN, inside the gears 313UP, 313UN, are secured to the shafts 333UP, 333UN fitted in through holes provided in each support member at a first end thereof. The panel wiping rollers 310UN, 310UP are rotatably supported inside the support members 312UP, 312UN at second ends thereof. Suction ports 334 are provided behind the second ends of the support members 312UP, 312UN, as shown in FIG. 5. The right and left portions of support member 312UN are attached to knuckles 346 at the upper ends thereof so that the support members and the knuckles are rotatable relative to each other. The piston rods of the pneumatic cylinders 314 for the panel wiping rollers are screw-engaged in the knuckles 346 at the lower ends thereof and secured thereto by nuts. The cylinders 314 are secured to the attaching members 315.

When the heat and pressure applying rollers 300UN, 300UP begin applying the stratified films 1B to the panel 22 under heat and pressure, as shown in FIGS. 5–7, a counter (not shown in the drawings) begins counting signals from a rotary encoder (not shown in the drawings) attached to the heat and pressure applying roller drive motor 301. Based on a signal outputted from the counter when the count thereof reaches a predetermined value, the piston rods of the pneumatic cylinders 314 for the panel wiping rollers protrude upwardly so that the panel wiping roller support members 312UN are swung about the shafts 333UN and lift the panel wiping roller 310UN. Since the shafts 333UN are secured to both the panel wiping roller support members 312UN and the wiping roller kinematic coupling gears 313UN, engaged with the wiping roller kinematic coupling gears 313UP, also are secured to the shafts, panel wiping roller 310UP is moved downwardly toward the panel conveyance passage when panel wiping roller 310UN is lifted toward the passage so that an air bubble preventive agent, such as water, which may cling to the top and bottom of the panel 22 having the films 1B applied thereon, is wiped from the panel.

Based on a detection signal outputted from a panel passing sensor (not shown in the drawings) having detected the passing of the panel 22, the panel wiping rollers 310UN, 310UP are returned to their original positions (i.e., their positions prior to wiping/removing the air bubble preventive agent from the panel). Thus, wiping the panel 22 is completed. The panel wiping portions of the wiping rollers 310UN, 310UP are cylindrical, sponge-like portions which wipe the air bubble preventive agent from the panel and discharge the agent while a suction force is imparted through the panel wiping portions and the suction ports 334.

To wipe the air bubble preventive agent from the heat and pressure applying rollers 300UP, 300UN, guide rails 307 are secured by screws to the upper and lower inside portions of the right and left end portions of the heat and pressure applying roller mounting frame 302. Additionally, attaching members 306 for the heat and pressure applying roller wiping rollers are slidably fitted on the guide rails, as shown in FIGS. 1 and 3. Panel wiping roller support members 305 are secured by screws to each wiping roller attaching member 306 at a first end thereof, which is located at the heat and pressure applying roller.

The wiping rollers 304UN, 304UP for the heat and pressure applying rollers are rotatably supported by the upper and the lower panel wiping roller support members 305. Suction ports 305' are provided outside the support members 305. The piston rods of the pneumatic cylinders 308 for the wiping rollers are screw-engaged in each attaching member 306 at a second end thereof and secured thereto by nuts. The cylinders 308 are secured by screws to pneumatic cylinder attaching member 309, which are in turn secured by screws to the heat and pressure applying roller mounting frame 302.

After the heat and pressure applying rollers 300UN, 300UP move away from the panel conveyance passage I—I after applying the films 1B to the panel 22, the piston rods of the pneumatic cylinders 308 are protruded so that the wiping rollers 304UN and 304UP for the applying rollers 300UN, 300UP are pressed onto the applying rollers so as to wipe the air bubble preventive agent therefrom. Based on a detection signal outputted from the panel passing sensor (not shown in the drawings) having detected the passing of the panel 22, the wiping rollers 304UN and 304UP return to their original positions (i.e., their positions before wiping the heat and pressure applying rollers 300). Thus, wiping of the applying rollers 300UN, 300UP is completed. The wiping rollers 304 are made of cylindrical, sponge-like bodies which wipe/remove the air bubble preventive agent from the heat and pressure applying rollers 300UN, 300UP and discharge the air bubble preventive agent while a suction force is imparted through the sponge-like bodies and the suction ports.

As shown in FIG. 1, a guide plate 324 is attached with guide plate support members 325 to the downstream portion of the downstream conveyor mounting frame 303 with regard to the panel conveyance direction Y. The guide plate 324 is secured by screws to the support members 325 (which is secured to the mounting frame 303), and can be swung about an end of each support member 325 in a direction shown by an arrow Z in FIG. 1. Thus, the guide plate 324 can be opened and closed.

The movable panel conveyance section including the downstream conveyor mounting frame 303 and a wiping means comprising the heat and pressure applying roller wiping rollers 304UP, 304UN and the panel wiping rollers 310UP, 310UN is secured to the heat and pressure applying roller mounting frame 302. The mounting frame 302 is moved backwardly and forwardly together with the heat and pressure applying rollers 300UN, 300UP by the pneumatic cylinders 351, secured to the body frame 347 of the applying apparatus, so that the movable panel conveyance section having the wiping means and the heat and pressure applying rollers are always kept in a fixed positional relationship with each other.

When the heat and pressure applying roller mounting frame 302 is moved forwardly, the fixed conveyance portion (an outlet conveyor mounting frame 359 shown in FIG. 3) of the downstream conveyor of the applying apparatus remains in a prescribed position, thus forming a gap between the movable panel conveyance section and the fixed conveyance portion. To prevent this gap from affecting the panel conveyance, outlet conveyor rollers 360, as shown in FIG. 3, are provided at intervals on the front of the fixed conveyance portion opposed to the movable conveyance portion, and the guide plate 324 is provided in the movable panel conveyance section and secured to the guide plate support members 325. Thus, with this arrangement, no gap is formed between the movable panel conveyance section and the fixed conveyance portion. The guide plate 324 may have a comb-like shape and the outlet conveyors 360 may partially protrude through the guide plate 324.

With the above-described configuration, the movable panel conveyance section is moved together with the heat and pressure applying rollers 300UN, 300UP which are moved to a tentative applying position where film feed members tentatively apply the leading edges of the stratified films 1B to the panel, and thereafter the rollers 300UN, 300UP firmly apply the films to the panel 22 by heat and pressure. As described above, the guide plate 324 also is provided to prevent a gap from forming between the downstream conveyance section and the fixed conveyance portion of the downstream conveyor. Thus, even if the panel 22 has a small thickness, the panel can be surely conveyed while being applied with films 1B under heat and pressure, and the panel is prevented from falling off the fixed conveyance portion of the downstream conveyor. Thus, the panel is surely conveyed to the next process. Moreover, the wiping means wipes the excess air bubble preventive agent from the heat and pressure applying rollers 300UN, 300UP and the panel 22 so as to prevent contamination of the panel by the excess air bubble preventive agent, as well as to prevent current from leaking from the apparatus' electrical system.

Figure 8:
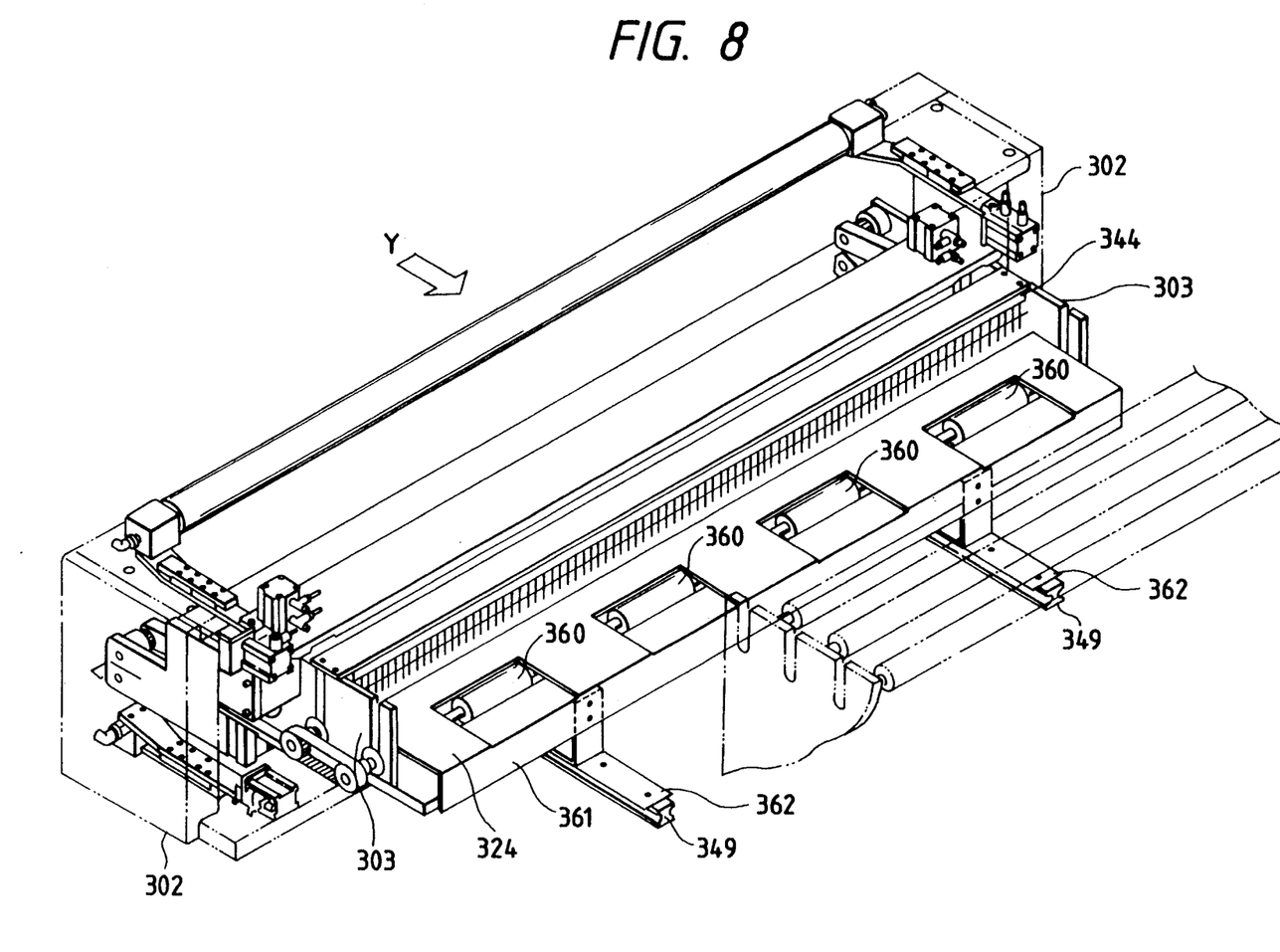
FIG. 8 is a perspective schematic view of the movable panel conveyance section of a second embodiment of an applying apparatus according to the invention.

FIG. 8 shows a movable panel conveyance section of an applying apparatus which is a second embodiment of the present invention. In this embodiment, the movable panel conveyance section does not include a roller such as the aluminum roller 353B of the first embodiment, but it does include outlet conveyor rollers 360. A lower guide plate 361 is provided so as to prevent a gap from forming between the movable panel conveyance section and the fixed conveyance portion of the downstream conveyor of the applying apparatus. The guide plate 361 is secured by screws to lower guide plate securing members 362 (which are secured by screws to slide rails 349). A static electricity elimination member 344 is provided on a downstream conveyor mounting frame 303, located behind the movable panel conveyance section with regard to viewing in the panel conveyance direction Y. Since the lower guide plate 361 can be moved in the direction Y and in a direction opposite thereto, the fixed conveyance portion of the downstream conveyor is easily slidable to perform maintenance, trouble-shooting, or the like for the movable panel conveyance section.

According to the present invention, a panel is conveyed while being applied with films under heat and pressure on its top and bottom surfaces by pressure applying rollers of an applying apparatus, and the panel is prevented from falling between a downstream conveyor of the apparatus and the pressure applying rollers. Additionally, an excess air bubble preventive agent, which prevents the generation of air bubbles in the films applied to the panel and which clings to the panel having the films applied thereon, is removed from the panel, thereby preventing the contamination thereof and preventing electricity from leaking from the applying apparatus' electrical system.

The present invention is not confined to the embodiment described above, but may be embodied or practiced in other various ways without departing from the spirit or essential character thereof. Thus, the scope of the invention should be considered as limited only by the appended claims

What is claimed is:

1. An applying apparatus for applying films to a panel, comprising:
    film feed means for feeding leading edges of said films to a tentative applying position and tentatively applying said leading edges of said films to said panel;
    applying means, movable to said tentative applying position, for applying said films to said panel; and
    movable panel conveyance means for moving said panel having said films applied thereon, said movable panel conveyance means being coupled to said applying means and being movable together therewith, said movable panel conveyance means being movable in a direction of conveyance of said panel and in a direction opposite thereto, wherein said movable panel conveyance means includes a support frame, said applying means being coupled to said support frame such that said movable panel conveyance means and said applying means have a fixed positional relationship to each other.

2. An applying apparatus according to claim 1, further comprising a downstream conveyor for conveying said panel after said films have been applied thereto, and wherein said downstream conveyor comprises said movable panel conveyance means and a fixed conveyance portion.

3. An applying apparatus according to claim 1, wherein said apparatus includes a downstream conveyor comprising a fixed conveyance portion, and wherein said movable panel conveyance means comprises a guide plate for preventing a gap from being formed between said movable panel conveyance means and said fixed conveyance portion of said downstream conveyor.

4. An applying apparatus according to claim 2, wherein said movable panel conveyance means comprises a guide plate for preventing a gap from being formed between said movable panel conveyance means and said fixed conveyance portion of said downstream conveyor.

5. An applying apparatus according to claim 1, wherein said movable panel conveyance means comprises holding rollers for securely conveying said panel while being applied with said films.

6. An applying apparatus according to claim 2, wherein said movable panel conveyance means comprises holding rollers for securely conveying said panel while being applied with said films.

7. An applying apparatus according to claim 3, wherein said movable panel conveyance means comprises holding rollers for securely conveying said panel while being applied with said films.

8. An applying apparatus according to claim 4, wherein said movable panel conveyance means comprises holding rollers for securely conveying said panel while being applied with said films.

9. An applying apparatus according to claim 1, further comprising air bubble preventive agent application means for applying an air bubble preventive agent to said panel so as to cling to said panel; and wiping means for wiping off excess air bubble preventive agent clinging to said applying means and said panel while being applied with films.

10. An applying apparatus according to claim 2, further comprising air bubble preventive agent application means for applying an air bubble preventive agent to said panel so as to cling to said panel; and wiping means for wiping off excess air bubble preventive agent clinging to said applying means and said panel while being applied with films.

11. An applying apparatus according to claim 3, further comprising air bubble preventive agent application means for applying an air bubble preventive agent to said panel so as to cling to said panel; and wiping means for wiping off excess air bubble preventive agent clinging to said applying means and said panel while being applied with films.

12. An applying apparatus according to claim 4, further comprising air bubble preventive agent application means for applying an air bubble preventive agent to said panel so as to cling to said panel; and wiping means for wiping off excess air bubble preventive agent clinging to said applying means and said panel while being applied with films.

13. An applying apparatus according to claim 5, further comprising air bubble preventive agent application means for applying an air bubble preventive agent to said panel so as to cling to said panel; and wiping means for wiping off excess air bubble preventive agent clinging to said applying means and said panel while being applied with films.

14. An applying apparatus according to claim 1, wherein said applying means comprises pressure applying rollers.

15. An applying apparatus according to claim 1, wherein said applying means comprises heat and pressure applying rollers.

16. An applying apparatus according to claim 1, wherein said film feed means comprises a vacuum suction plate.

17. An applying apparatus according to claim 3, wherein said applying apparatus further comprises support members for said guide plate, and wherein said guide plate is swingable about an end of each of said support members so as to be openable and closable.

18. An applying apparatus according to claim 4, wherein said applying apparatus further comprises support members for said guide plate, and wherein said guide plate is swingable about an end of each of said support members so as to be openable and closable.

19. An applying apparatus according to claim 5, wherein one of said holding rollers is urged toward a second of said holding rollers to hold said panel.

20. An applying apparatus according to claim 5, wherein said holding rollers and said applying means are rotated simultaneously.

21. An applying apparatus according to claim 9, wherein said air bubble preventive agent applying means comprises a roller for applying said air bubble preventive agent to said panel.

22. An applying apparatus according to claim 9, wherein said wiping means comprises a roller having a sponge-like body, said roller being brought into contact with said applying means.

23. An applying apparatus according to claim 9, wherein said wiping means comprises a roller having a sponge-like body brought into contact with said panel.

24. An applying apparatus according to claim 9, wherein said wiping means comprises a roller having a sponge-like body brought into contact with said panel and said applying means.

25. An applying apparatus according to claim 5, wherein said movable panel conveyance means further comprises a pair of aluminum rollers, and wherein said holding rollers, said aluminum rollers and said applying means are rotatable simultaneously.

26. An applying apparatus according to claim 25, wherein said applying means comprises energizing means for energizing said applying means, and wherein said holding rollers, said aluminum rollers, and said applying means are rotatable simultaneously by said energizing means.

27. An applying apparatus according to claim 3, wherein said movable panel conveyance means further comprises a lower guide plate and outlet conveyor rollers, said lower guide plate being movable in a direction of conveyance of said panel and in a direction opposite thereto.

28. An applying apparatus according to claim 1, wherein said applying means is kept in a fixed positional relationship with said movable panel conveyance means.

29. An applying apparatus according to claim 3, wherein said fixed conveyance portion comprises outlet conveyor rollers.

30. An applying apparatus according to claim 3, wherein said downstream conveyor further comprises a plurality of axially divided outlet conveyor rollers positioned at intervals on an end of the fixed conveyance portion opposed to said moveable conveyance portion, wherein said guide plate has a comb-like shape, and wherein said outlet conveyor rollers partially protrude through said guide plate.

* * * * *